United States Patent
Huang et al.

(10) Patent No.: US 11,961,714 B2
(45) Date of Patent: Apr. 16, 2024

(54) SUBSTRATE PROCESSING APPARATUS

(71) Applicant: LINCO TECHNOLOGY CO., LTD., Taichung (TW)

(72) Inventors: Yi-Yuan Huang, Taichung (TW); Yi-Cheng Liu, Taichung (TW)

(73) Assignee: LINCO TECHNOLOGY CO., LTD., Taichung (TW)

( * ) Notice: Subject to any disclaimer, the term of this patent is extended or adjusted under 35 U.S.C. 154(b) by 243 days.

(21) Appl. No.: 17/334,855

(22) Filed: May 31, 2021

(65) Prior Publication Data

US 2022/0285132 A1 Sep. 8, 2022

(30) Foreign Application Priority Data

Mar. 8, 2021 (TW) .................................. 110108210

(51) Int. Cl.
*H01J 37/32* (2006.01)
*H01J 1/00* (2006.01)
*H01J 3/00* (2006.01)
*H01J 5/00* (2006.01)

(52) U.S. Cl.
CPC ................... *H01J 37/32357* (2013.01); *H01J 37/32449* (2013.01); *H01J 37/32522* (2013.01); *H01J 37/32743* (2013.01); *H01J 37/32834* (2013.01); *H01J 2237/3341* (2013.01)

(58) Field of Classification Search
CPC ............. H01J 37/3244; H01J 37/32449; H01J 37/32899; H01J 37/32192; H01J 37/32284; H01J 37/32458; H01J 37/32743
See application file for complete search history.

(56) References Cited

U.S. PATENT DOCUMENTS

2014/0230729 A1* 8/2014 Brandon ................ C23C 16/511
118/723 MW
2014/0374024 A1* 12/2014 Nguyen ............ H01J 37/32357
156/345.31

* cited by examiner

*Primary Examiner* — Wei (Victor) Y Chan
(74) *Attorney, Agent, or Firm* — ScienBiziP, P.C.

(57) ABSTRACT

A substrate processing apparatus comprises a chamber member that defines an interior volume that has an aspect ratio. The chamber member comprises a pair of laterally opposing inlet walls and a loading port. Each of the pair of laterally opposing inlet walls has an inlet port configured to receive output from a remote plasma source. The loading port is arranged between the pair of inlet walls, configured to allow passage of a substrate into the interior volume.

19 Claims, 11 Drawing Sheets

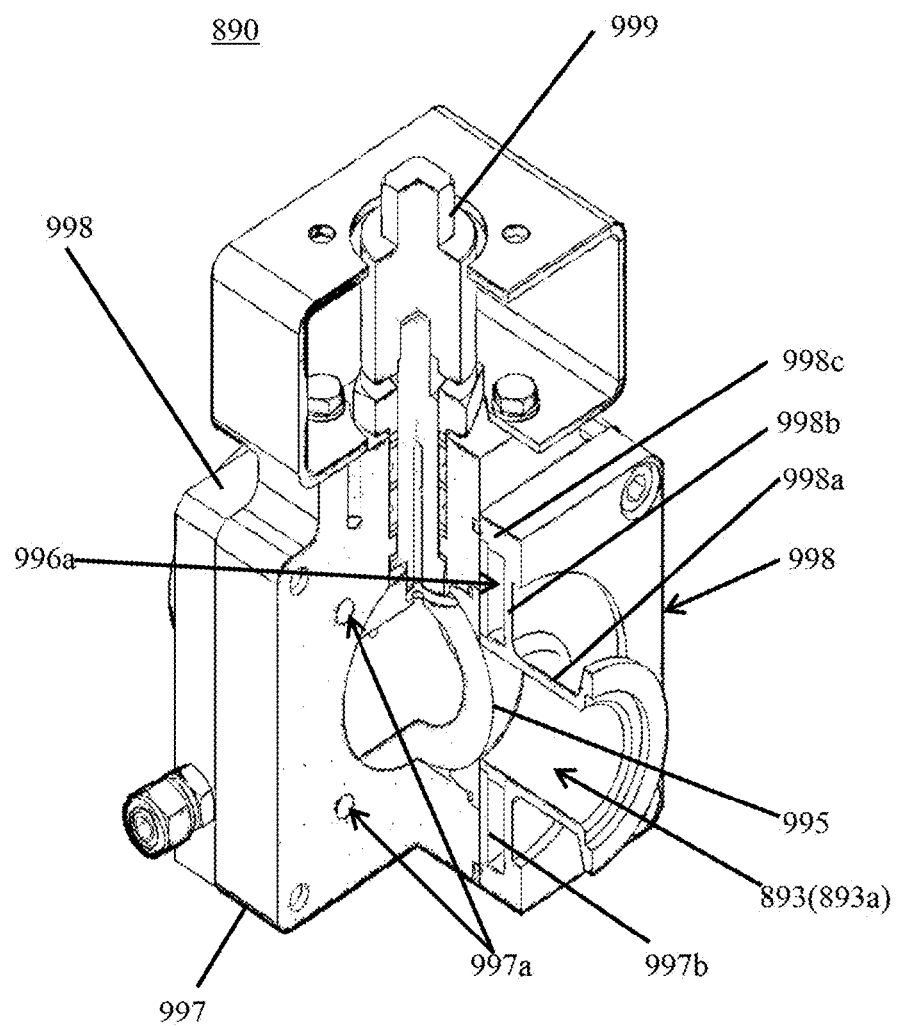
Fig.9
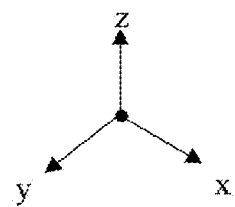

SUBSTRATE PROCESSING APPARATUS

CROSS-REFERENCE TO RELATED APPLICATIONS

This application claims the benefit of Taiwan Patent Application No. 110108210 filed on Mar. 8, 2021, which is hereby incorporated by reference herein and made a part of specification.

FIELD

The present disclosure relates to processing equipment, and in particular to substrate processing equipment that incorporates remote plasma source (RPS).

BACKGROUND

The International Technology Roadmap for Semiconductors (ITRS) pointed out that the traditional CMOS process is close to its limit. In response to the continuous growth of industry and the reduction of the cost per unit function, new device types, new packaging architecture, and new materials are required. Particularly, as Moore's Law approaches its end, the development of the semiconductor industry may switch focus to heterogeneous integration. As a result, system in package (SiP) technology would become a critical solution that balances both performance diversity and cost. In response to this new architecture, embedded devices that include printed circuits, thinner wafers, and active/passive may be vigorously developed. The fabrication tools/equipment and process materials used in advanced packaging may also undergo rapid changes to meet the demand of the new architecture. In the next 15 years, the focus of heterogeneous integration may be placed on assembly, packaging, testing, and interconnection technologies.

Advanced packaging technology such as embedded die in substrate (EDS), embedded passive in substrate (EPS), and fan-out panel level package (FOPLP) often calls for the use of composite substrate having dielectric insulating materials, semiconductor element chips, and metal wirings embedded therein. In some fabrication processes where EDS, EPS, or FOPLP packaging techniques are applied, the singulated semiconductor components, passive components or metal bump (e.g., copper pillar) are arranged and buried in a large organic insulating material (such as molding compound, Copper Clad Laminate (CCL), Ajinomoto Build-up Film (ABF), or dry film photoresist); then unnecessary organic insulating material is thinned by grinding to selectively expose chip components or metal wires. However, during the grinding process, the chip or component may be damaged by external stress.

In some applications, plasma processing systems may be used to thin the unnecessary organic insulating substrates or materials. In such systems, the substrate may be disposed horizontally in a plasma chamber so that its top surface is allowed to contact reactive gas or plasma from there-above. In some applications, opposite sides of the substrate are both required to be etched. The substrate can be turned over so that the two opposite sides of the substrate can be etched sequentially. However, the procedure of turning the substrate over for sequentially processing would be time-consuming.

BRIEF DESCRIPTION OF DRAWINGS

The invention can be more fully understood by reading the following detailed description of the embodiment, with reference made to the accompanying drawings as follows:

FIGS. 9 and 10 respectively shows a schematic cross-sectional view of a valve module according to some embodiments of the present disclosure;

Figure 1:
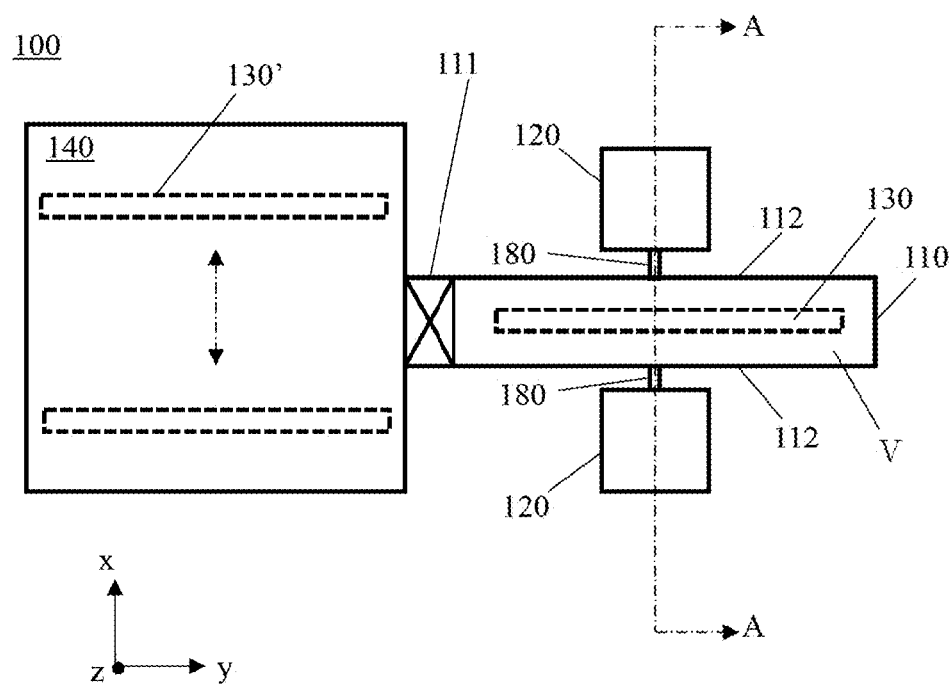
FIG. 1 shows a schematic top view of a substrate processing apparatus according to some embodiments of the present disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments will be described in conjunction with the drawings from FIGS. 1 to 11. The present disclosure will be described in detail with reference to the accompanying drawings, in which the depicted elements are not necessarily shown to scale, and through several views, the same or similar reference signs may be used to denote the same or similar elements.

FIG. 1 shows a schematic cross-sectional view of a substrate manufacturing apparatus according to some embodiments of the present disclosure. For simplicity and clarity of description, some details/sub-components of the exemplary system are not clearly marked/shown in this figure.

In some embodiments, the substrate processing apparatus 100 is configured to process the opposite sides of a workpiece (not shown) concurrently. The processing workpiece may be a substantially planar object generally referred to as a substrate, which provides mechanical support to subsequently formed electrical components formed thereon. In some applications, the substrate may be a semiconductor wafer. In some applications, e.g., panel level processes such as FOPLP packaging applications or advanced IC board with thin circuit traces, the substrate may include large size glass substrate, epoxy molding compound, copper clad laminate, or coreless substrate.

The substrate processing equipment 100 includes a substrate carrier 130 configured to retain a substrate, a chamber member 110 defining an interior volume V for receiving the substrate carrier 130, and a pair of remote plasma sources (RPS) 120 in fluid communication with the chamber member 110. The chamber member 110 includes a pair of inlet walls 112, each of the walls 112 is provided with an inlet configured to allow the output of the remote plasma source 120 to enter the internal space V. In the illustrated embodiment, a connecting pipe 180 is provided between the inlet and the remote plasma source 120 so that the output of the RPS 120 can enter the internal space V through the connecting pipe 180. When the substrate carrier 130 is in the interior space V, the pair of entrance walls 112 are respectively located at two opposite sides of the substrate carrier 130 (and the retained substrate). Such arrangement enables the output from the two RPSs 120 to be concurrently received over opposite sides of the substrate, thereby enhance the process (e.g., etching) efficiency.

In the current top view, the entrance walls 112 constitute the longitudinal sides of the chamber member 110. The intake walls 112 are arranged opposite to each other in the lateral direction (for example, the width direction of the internal space V, that is, the x direction in the figure). The chamber member 110 is provided with a loading port 111 arranged laterally between the pair of inlet walls 112. The loading port 111 is configured to allow the substrate carrier 130 together with the substrate retained thereon to pass into the internal space V. In some embodiments, the chamber member 110 further includes a valve configured to close the port 111. When the valve is opened, the substrate is allowed to be transported into/out of the internal space V by the substrate carrier 130. In some embodiments, the substrate processing equipment 100 further includes a buffer chamber 140 (for example, a loading/unloading chamber) arranged in connection with the loading port 111 of the chamber member 110. When the substrate carrier 130' is located in the buffer cavity 140, the substrate can be loaded or unloaded. The buffer chamber 140 is provided with an inner space, in which the substrate carrier 130' is allowed to be moved at least in the x direction. The substrate carrier 130 is configured to move between the cavity member 110 and the buffer cavity 140.

The substrate processing equipment 100 can be operated to perform many processes that apply plasma, e.g., using plasma to etch and/or thin down dielectric insulating materials. Take EDS, EPS, or FOPLP packaging applications for example, some applications call for the thinning of dielectric insulating materials (such as Epoxy Molding Compound (EMC) and ABF (Ajinomoto Build-up Film, ABF) insulating film) to achieve, e.g., surface flattening/planarization and/or die exposure. In addition to the above-mentioned thinning process of insulating materials, the substrate processing equipment 100 may also be utilized for, e.g., removal of surface organic or inorganic residues, ashing process, photoresist stripping, hydrophilic and hydrophobic surface treatment processes (such as modification and surface cleaning), descum or desmear removal, etching treatment after laser treatment, ashing treatment of photoresist, etching treatment of titanium film, $SiO_2$ film or $Si_3N_4$ film metal oxide film plasma reduction treatment.

In some applications, the utilization of RPS may allow most of the generated charged particles (e.g., ions and electrons) from the plasma generator to be kept from the process chamber (such as the internal space V), while granting passage of the electrically neutral free radicals into the processing chamber through the inlet component (such as the inlet wall 112). The use of free radical may enable lowered processing temperature for certain delicate applications. In some applications, when the gas from a gas source reaches sufficient gas flow rate (e.g., several standard liters per minute (SLM), the dissociation rate of the remote plasma source for the process gas may reach 95% or more. Thus, in some embodiments, the remote plasma source may also be referred to as a free radical plasma source. For instance, in plasma etching processes, the etching rate over the workpiece is proportional to the density of free radicals in the process chamber. Because the free radicals generated by the remote plasma source predominately induce chemical reaction over the surface of the substrate, the resulting lowered thermal loading and reduced ion bombardment by using RPS may help to minimize physical damage to the workpiece in a various of applications such as high-speed etching, ashing, desmearing, descum, cleaning, or surface modification/activation treatment operations.

The remote plasma source is configured to receive various gases (for example, from a gas source), such as fluorine-containing reactant gas (such as $CF_4$, CxFy, $SF_6$, $NF_3$, $CHF_3$ or their mixed gas) and cleaning gas (such as $O_2$, $O_3$, $H_2O$, $H_2$, He, $N_2$, Ar or their mixed gas). The addition of $N_2$ gas may increase plasma density and prolong the lifetime of output gas in free radical form. The gas source may provide the gas at a controlled flow rate. For instance, when the fluorine-containing gas is provided to the remote plasma source, the flow rate may be regulated to be within about 10 to 6000 sccm. For example, in various embodiments, the fluorine-based gas may be provided at a flow rate between about 10 to 3000 sccm, between about 10 to 2000 sccm, or between about 10 to 1000 sccm. Likewise, when the cleaning gas is supplied to the RPS, the flow rate may be controlled between about 10-6000 sccm. For example, in various embodiments, the flow rate of the cleaning gas may be regulated between about 10 to 5000 sccm, about 10 to 4000 sccm, about 10 to 3000 sccm, about 10 to 2000 sccm, or about 10 to 1000 sccm.

The remote plasma source may adopt inductively-coupled plasma source (ICP), capacitively coupled (CCP) remote plasma source, and a microwave remote plasma source (Microwave RPS), or a combination thereof. In an embodiment wherein an inductively coupled remote plasma source (ICP RPS) is used, the driving frequency thereof may be set to about 0.4 to 13.56 MHz. In an embodiment using a very high frequency (VHF) capacitive coupling type remote plasma source, the driving frequency be set to about 40 to 100 MHz. In some embodiments where a microwave remote plasma source (Microwave RPS) is used, the driving frequency may be set to about 900 to 6000 MHz Hz. In some embodiments that incorporate RPS, the output power may be in the range of about 1-3 kW, 1-6 kW, 1-8 kW, 1-10 kW, or 1-15 kW.

The substrate processing equipment 100 may also include, or otherwise in connection with, an exhaust/extract system (not shown), which is configured to apply a negative pressure to the internal space V (or the process volume) to generate vacuum condition. In some applications, the operating pressure in the chamber may be controlled at about 50-5000 mTorr.

Figure 2:
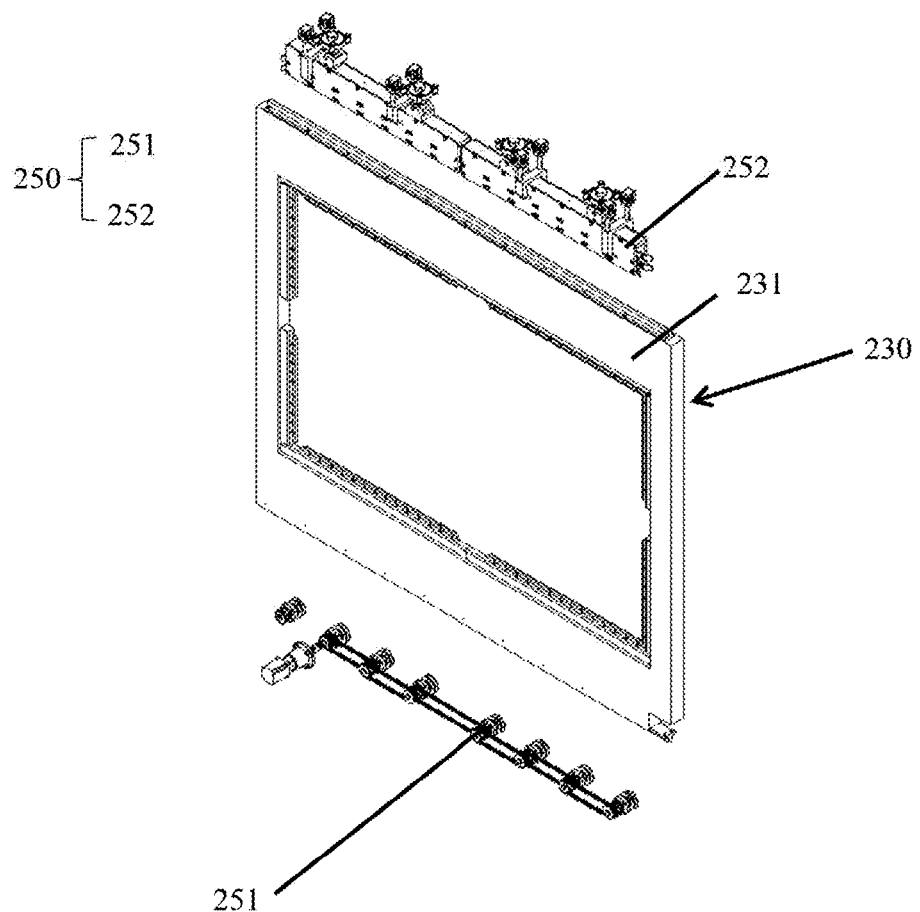
FIG. 2 shows a schematic view of a substrate carrier according to some embodiments of the present disclosure.

FIG. 2 shows a schematic view of a substrate carrier according to some embodiments of the present disclosure. For simplicity and clarity of description, some details/subcomponents of the exemplary system are not marked/shown in this figure.

Referring to FIG. 2, in the illustrated embodiment, the substrate carrier 230 includes a retaining frame body 231 configured to hold the edge of a substantially rectangular substrate (not shown) while exposing the two opposite surfaces thereof. Besides, the holding frame 231 is configured to be arranged in the internal space (e.g., volume V of FIG. 1) in a substantially upright fashion. As such, the opposite surfaces of the substrate may both be exposed to the output from the RPSs (e.g., 120). Comparing to horizontal etching, vertical etching process may reduce the by-products falling onto the surface of the substrate, thereby improving the product yield. Based on the low thermal load and ion bombardment characteristics of the RPS, when the opposite sides of the substrate/workpiece are concurrently etched by the output of RPS, the physical damage of the substrate/workpiece would be alleviated.

In the illustrated embodiment, the apparatus further includes a transport device 250 configured to transport the substrate carrier 230 at least in the length direction of the internal space V (e.g., y-direction). Operations such as loading/unloading of the substrate and/or location adjustment of the substrate with respect to the inlet wall (e.g., 112) would be achieved with the help of the transport device 250. The transport device 250 may include a drive rail 251 configured to support and transport a bottom part of the substrate carrier 230, and a magnetic rail 252 configured to laterally maintain a top portion of the substrate carrier 230.

The vertically oriented substrate carrier 230 and the substrate S are allowed to be transported into the internal space V via the loading port 111 shown in FIG. 1. In some embodiments, the loading port 111 is provided with an aspect ratio (that is, a length ratio of z direction over x direction) no greater than 1. The low aspect ratio of the loading port 111 allows the chamber member 110 and the internal space V to be arranged with a low aspect ratio (i.e., depth over width direction, e.g., z over x) not greater than 1. As such, a distance between the inlet wall 112 and the received substrate S would be kept small. Such small distance is beneficial to the utilization of output from the RPS.

Figure 3:
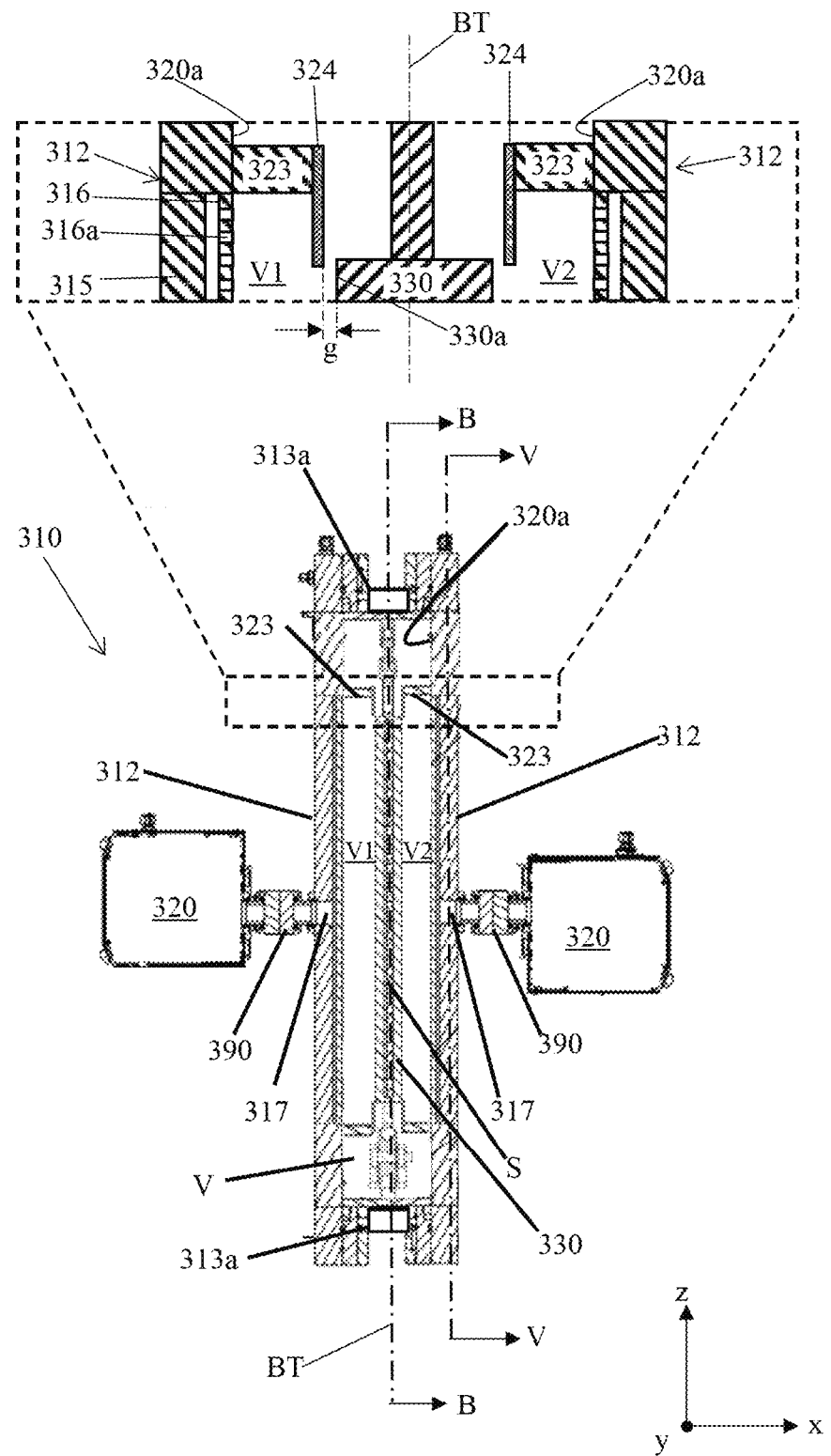
FIGS. 3 and 4 respectively shows a schematic cross-sectional view of a substrate processing apparatus according to some embodiments of the present disclosure.

FIG. 3 shows a schematic cross-sectional view of a substrate processing equipment according to some embodiments of the present disclosure. For simplicity and clarity of illustration, some details/subcomponents of the exemplary system are not explicitly labeled/shown in this figure. FIG. 3 may be a taken along A-A cutline in FIG. 1.

In the illustrated embodiment, the chamber member 310 includes a pair of inlet walls 312, each of which defines an inlet 317 in fluid communication with a remote plasma source 320, thus enabling the chamber 310 to receive output from the RPSs 320. A substrate carrier 330 holding the edge of a substrate S is located in the internal space V between two entrance walls 312. As such, the two opposite surfaces of the substrate S are allowed to be exposed to the output of the RPS 320. In current cut view, the substrate S defines a bisecting plane BT that divides the internal space V. In addition, the pair of exemplary RPSs 320 are substantially symmetrical arranged with respect to the bisecting plane BT. In other words, the distances between the substrate S and the two RPSs 320 are maintained substantially the same. Such arrangement is beneficial to maintain the etching rates respectively around both sides of the substrate S approximately the same.

The uniformity of the output of the RPS 320 over the surface of the workpiece S affects the process efficiency. Generally, the inlet wall 312 is provided with a configuration that is beneficial to the uniformity. For example, in the enlarged view of the area shown in the dashed frame, each inlet wall 312 is formed with a distribution hole pattern 316a facing the workpiece S, which is configured to evenly distribute the output from the RPS 320 to the surface of the workpiece S. In the illustrated embodiment, the distribution hole pattern 316a is formed on a plasma distribution member 316 arranged in a substantially parallel relationship with respect to the substrate S, thereby facilitating the uniform distribution of free radicals/working gas on the workpiece. In some embodiments, one of the inlet walls 312 may be integrally formed with the cavity member 310. In some embodiments, the distance between the shower head 316 and the substrate S is substantially in a range of 10 to 200 mm, such as 30 or 90 mm. At least one of the exemplary inlet walls 312 comprises a lid member 315 detachable from the chamber member 310 and configured to establish a sealing engagement therewith.

In some embodiments, the chamber member 310 is further provided with one or more exhaust ports configured to allow by-products generated after the reaction to be discharged from the internal space V. For example, in the current cross-sectional view, two exemplary exhaust ports 313a are respectively arranged at top and bottom portions of the process chamber 310. The exhaust port 313a comprises an opening formed on the chamber body. In particular, the two exhaust ports 313a are both arranged on the bisecting plane BT and symmetrical to the geometric center of the substrate S in the depth direction. The symmetrical arrangement of the exhaust port 313a is beneficial to the uniformity of by-product exhaustion. In some embodiments, the diameter of the exhaust channel (for example, the suction port 313a) is in a range of about 25 mm to 150 mm. In some embodiments, the apparatus further includes an exhaust/vacuum device (not shown in the figure) in connection with the exhaust ports. When the exhaust/vacuum device is activated, the by-products would be exhausted from the chamber member.

The output of the RPS 320 entering the chamber is expected to be confined over the surface of the workpiece S for high process efficiency. In some embodiments, each of the inlet walls further comprises an annular partition structure 323 configured to confine the output from the remote plasma source 320 over the surface of the substrate S. The annular partition structure 323 is arranged protruding from the surface 320a of the inlet wall 320 facing the substrate S. In the B-B cross-sectional view (for example, the cross-sectional view shown in FIG. 4), the annular partition structure 323 is arranged to surround the distribution hole pattern 316a. The annular partition structure 323 is arranged proximate to an edge 330a of the substrate carrier 330. The edge 330a of the substrate carrier 330 is maintained at a position very close to the corresponding part of the annular partition structure 323 (for example, the perforated plate 324). As such, the two opposite surfaces of the substrate S and the two annular partition structures 323 respectively define two sub-spaces V1 and V2. The output from the remote plasma source 320 would be confined within the subspaces V1 and V2, so as to be maintained over two opposite sides of the substrate S.

In the enlarged view shown in the dashed frame, the annular partition structure 323 further comprises a perforated plate 324. The perforated plate 324 is arranged to face the inlet wall 312 (for example, the distribution hole pattern 316a of the inlet wall 312). When the exhaust/vacuum device is activated, the by-products generated after the reaction would be extracted from the subspace V1/V2 through the perforated plate 324. In some embodiments, the perforation diameter of the perforated plate 324 is approximately 0.5 to 5 mm, such as 0.8 mm. In some implementations, the through holes of the perforated plate 324 are evenly distributed, thereby by-products can be uniformly extracted from the subspace. In some embodiments, the perforated plate is arranged substantially symmetrically to the geometric center of the distribution hole pattern. Symmetrically arranged perforated plates are beneficial to the uniformity of free radical/reactive gas distribution.

In the placement of the carrier, if the edge of the substrate carrier 330 is too close to the perforated plate 324, the outer edge of substrate carrier 330 may rub against the perforated plate 324 during the movement of the substrate carrier 330. Such friction may shorten the life of the equipment, and may also produce particles that pollute the internal environment of the process chamber. In some embodiments, a lateral clearance g of a proper width is reserved between the outer edge of substrate carrier 330 and the perforated plate 324. In some embodiments, a width of the lateral clearance g is in a ranged from about 0.2 to 5 mm (e.g., 0.8 mm).

In some embodiments, a ratio between the aperture diameter of the perforated plate and the width of the carrier edge gap is in the range of about 0.6 to 25. However, if the gap is substantially larger than the aperture of the perforation, undesirable leaking of processing gas/free radicals may become pronounced, which may again cause uneven distribution of the reaction gas. In addition, the impact of operating temperature on the hardware during device operation also needs to be taken in design considerations. For example, while the gap width between the hardware structures depends on the precision of modern machining (which can be kept fairly small), if the gap dimension is too small (for example, less than 0.8 mm), the gap may be compromised due to thermal expansion of the tool components caused by the elevated temperature during operation. For example, in some processes under high temperature conditions, thermal expansion of the substrate carrier 300 may inevitably occur. As a result, the outer edge of the substrate carrier 300 may extends to reach the perforated plate 324. It has been found that a width of the lateral clearance g substantially equal to the aperture size of the perforated plate helps to maintain uniform distribution of processing gas over the substrate. For instance, in some embodiments, the gap width between the stage and the baffling ring is arranged to be substantially equal to the width of an aperture in the perforated plate. In some embodiments, a ratio between the aperture diameter of the perforated plate and the width of the lateral clearance is in the range of about 0.7 to 1.3, for example, 1.25.

In some operating scenarios, the free radicals from the RPS will generate a recombination reaction (exothermic reaction) in the pipeline (e.g., the passage between to the RPS and the plasma inlet) so as to cause elevation of temperature in the pipeline. In some cases, the elevation of temperature is pronounced and may cause excessive wear of the device hardware (e.g., O-ring). In some embodiments, the exemplary device in accordance with the instant disclosure is provided with a cooling mechanism 390. The cooling mechanism may include a liquid-cooled flow channel configured to receive cryogenic fluid (for example, water, other liquids or gases) from a fluid supply system. In some embodiments, the processing equipment further comprises a valve configured to regulate fluid communication in the pipeline. In some embodiments, the cooling mechanism 390 may further include a cooling chip (e.g., thermoelectric cooling module) in thermal contact with the valve body.

In some embodiments, in addition to the first plasma generating device (which includes the remote plasma source 320), the apparatus may further comprise a second plasma generating device (e.g., a local/onboard plasma generator) provided in the process chamber. In terms of hardware configuration, in some embodiments, the substrate carrier 330 may be configured to be coupled to an electrode member that receives output from a radio frequency (RF) power source. Meanwhile, the shower head component (e.g., the distribution component 316) may be configured to be electrically connected (e.g., to the ground), so that the shower head and the substrate carrier 330 respectively form a pair of opposite electrodes for the onboard/local plasma generator.

In an embodiment of dual plasma source configuration, the remote plasma source may employ one or more of inductively coupled remote plasma source (ICP RPS), capacitively coupled remote plasma source (CCP RPS), and microwave remote plasma source (Microwave RPS). On the other hand, the aforementioned radio frequency plasma source (i.e., the second plasma source) may adopt a capacitive coupling device. The plasma generator incorporated devices may be used to perform material reduction processes such as Reactive-Ion Etching (RIE). Exemplary applications of RIE may include ashing process, photoresist stripping, surfaces modification, cleaning and activation, descum, desmear, nitrogen/argon based plasma treatment for copper film to remove surface oxides/fluorides, or for surface roughening applications. In the illustrated embodiment, when RPS (first plasma generator) generates high-density reactive free radicals, high-frequency bias may be concurrently applied to the substrate stage (second plasma generator). With the help of physical and chemical etching, the rate of etching or plasma processing may be greatly improved. Generally speaking, for equipment that possesses only RF plasma source, the plasma density and ion bombardment energy are often not simultaneously adjustable. By increasing the RF power, the plasma density and the dissociation rate of the process gas can be increases, thereby enhancing the etching rate. However, high RF power setting may cause excessively large bombardment energy. As a result, the substrate material may be damaged due to excessive temperature or arc discharge. On the other hand, to prevent damage from excessive temperature, the range of the RF power setting may be restricted. However, the etching rate (e.g., when etching an insulating dielectric organic substrate such as epoxy resin molding compound or ABF build-up material) would be limited in a range from about 0.5 to 1 um/min as a result.

In contrast, the incorporation of a remote plasma source may boost the etching rate by 100% to 400%. For instance, compared with tools that possess only the onboard radio frequency sources, the application of remote plasma generation equipment allows the ion bombardment energy to be adjusted (e.g., from zero ion bombardment to hundreds of volts bias). As such, the process temperature may be reduced. Take packaging process for example, the application of RPS may help to maintain the temperature of the stage to no more than 100 Celsius degree. In some scenarios, the operating temperature is maintained under 50 Celsius degree. In some scenarios, the operating temperature is less than 30 Celsius degree.

With the demand for electrical compounds miniaturization, high frequency/switching speed, 5G substrate material, and micro circuit technology, there is a need for process temperature control due to the delicacy of advanced materials and the demand for high plasma uniformity over increased substrate size (e.g., panel-level process), the challenge of advanced fabrication process inevitably increases. To this end, the higher etching performance and lower operating temperature provided by the substrate processing equipment 100 in accordance with the instant disclosure allows it to replace traditional polishing process in many applications, thereby avoiding the problem of chip damage. Meanwhile, the use of high-density free radicals generated there-by may also increase etching rate, thereby ensuring improved productivity and yield.

On the other hand, the RF return path of the plasma generating device may be interrupted due to the aforementioned lateral clearance. In some embodiments, the substrate carrier 330 may be electrically coupled to the process chamber 310 through one or more conductive members (not shown) to establish an RF return path. The conductive member may be a strip, wire, or cable that provides an RF conductive medium. The return path arrangement for the RF current may be determined based on the electrical properties (e.g., conductivity/impedance) and placement of the conductive member. In addition, the positions or separation distance between the conductive members may be further tuned to modify the uniformity of electrical field, thereby increasing the uniformity of gas/plasma distribution and process stability. In some embodiments, the plasma distribution component 316 and the cover 315 may be made of conductive materials (such as aluminum) and be in electrical communication with each other.

Figure 4:
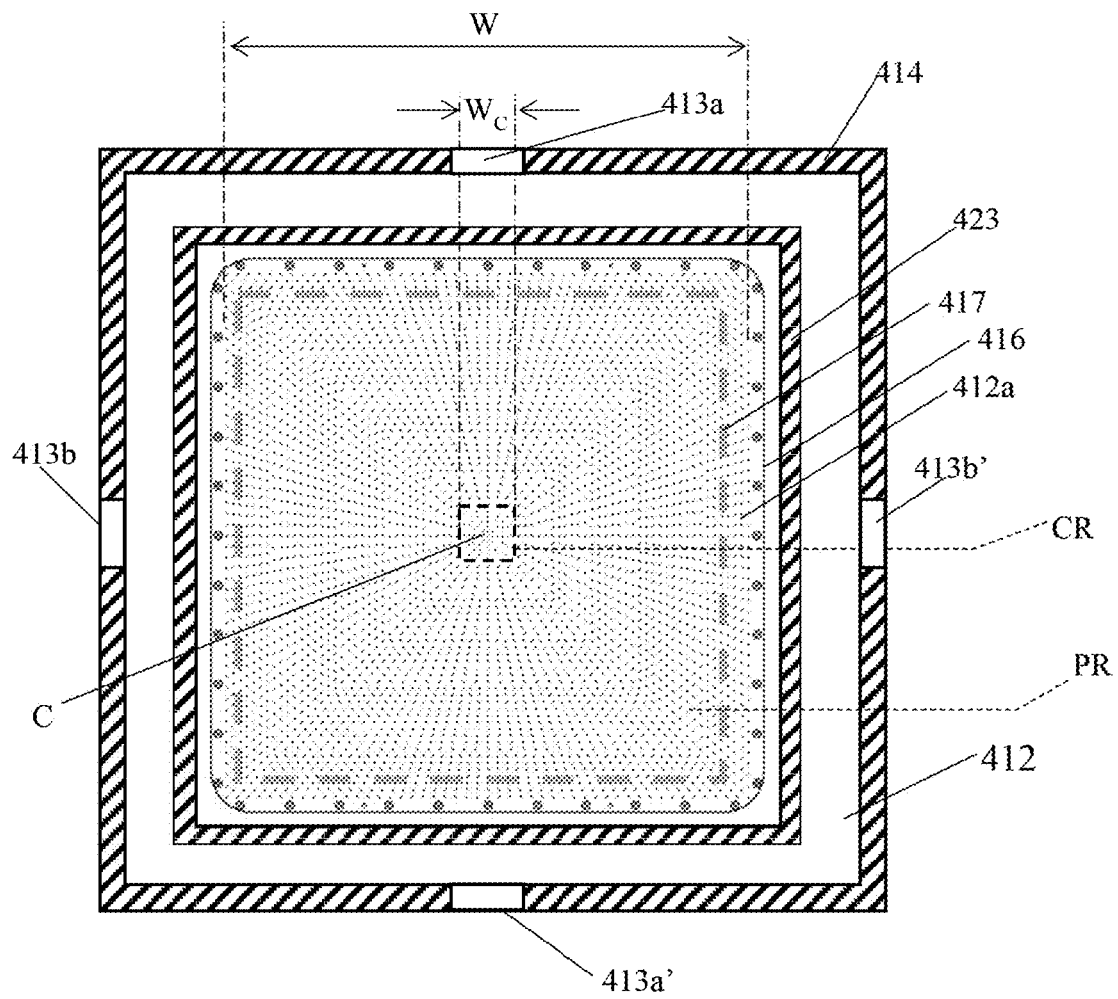

FIG. 4 shows a schematic cross-sectional view of a substrate processing apparatus according to some embodiments of the present disclosure. In some embodiments, FIG. 4 may be a cross-sectional view from bisecting plane BT in FIG. 3 toward x direction. For simplicity and clarity of description, some details/sub-components of the exemplary system are not explicitly marked/shown in this figure. For example, the substrate, substrate carrier, and the perforated plate shown in FIG. 3 are omitted in FIG. 4.

The inlet wall 412 shown in FIG. 4 comprises a lid member 415 and a distribution member 416 arranged thereon. In some embodiments, the distribution member 416 has a substantially rectangular shape with rounded corners. The distribution member 416 of the inlet wall 412 has a flow distribution aperture pattern 412a. The overall layout of the flow distribution pattern 412a presents a substantially rectangular profile. In the illustrated embodiment, the distribution pattern 412a is made up with a plurality layer of rectangular ring-shaped aperture arrays (e.g., the array indicated by the dotted line 417), distributed in a substantially concentric manner. The aperture array in a concentric rectangular layout facilitates the uniform flow of processing gas/free radicals over a substantially rectangular workpiece (e.g., a panel level substrate). In some embodiments, in each ring of the rectangular aperture array, a distance between adjacent holes (in the circumferential direction) is in a range of about 10 to 25 mm. In some embodiments, the distance is in a range of about 10.5 to 21.3 mm. The regular circumferential spacing may contribute to the uniformity of processing gas distribution. In some embodiments, a diameter of the distribution aperture is not greater than 2 mm (e.g., such as 1.8 mm). The dispensing angle/outlet direction of the distribution hole may be set to be vertical to the direction of the movement of the substrate carrier (for example, in the x direction).

In some embodiments, the distribution pattern 412a has a central area CR. The central region CR is configured to alleviate ultraviolet light exposure from a remote plasma source toward a process workpiece (e.g., substrate). The provision of the central region CR may also restrict free radicals from directly reaching and etching the substrate. For example, in some embodiments, a size of the apertures in the central region CR is smaller than the size of the apertures in the surrounding peripheral region PR, so as to reduce the direct ultraviolet light exposure to the substrate. In some embodiments, the width of the aperture in the central region CR may be less than about 1 mm, such as 0.8 mm. In some embodiments, the width of the hole in the peripheral area PR may be greater than about 1.5 mm, such as 1.8 mm. In some embodiments, the aperture density in the central region CR is lower than the density of holes in the peripheral region. In some embodiments, the dispensing direction/outlet angle of the aperture in the central region CR may be arranged offset the x direction (e.g., in a tilted manner). In some embodiments, the central area CR presents a substantially rectangular layout. In some embodiments, the pattern width Wc may account for about 8 to 10% of the total pattern width W of the plasma distribution member 416. The ratio of the central pattern area to the overall pattern coverage calls for mindful design considerations. If the central area CR is too large, it may hinder the uniform distribution of processing gas; if the ratio is too small, it may provide insufficient ultraviolet blockage for the substrate, which may result in the insufficient reduction of regional etch rate (e.g., in the region of the substrate that projectively overlaps with the central region CR). In some embodiments, a ratio between the overall pattern coverage to the central pattern size is in a range of about 60:1 to 120:1.

The annular partition structure 423 is provided with a substantially rectangular profile that continuously and circumferentially surround the distribution hole pattern 416a.

Such an arrangement is beneficial to confine the output from the PRS to the surface of the substantially rectangular substrate.

The exemplary chamber member 410 further comprises an annular wall 414 disposed between two inlet walls 412 (only one inlet wall 412 is shown in the current illustration). The annular wall 414 and the inlet wall 412 cooperatively define the internal space of the chamber member 410. In the current cut view, the annular wall 414 is substantially rectangular and equidistantly surrounds the annular partition structure 423.

In some embodiments, a plurality of exhaust ports of the chamber member may be symmetrically arranged around the distribution hole pattern, thereby improving the uniformity of exhaust. For example, the annular wall 414 of the chamber member 410 has first exhaust ports 413a, 413a' disposed around the distribution hole pattern 412a. Besides, the first exhaust ports 413a, 413a' are arranged symmetrical with respect to the geometry center C of the distribution hole pattern 412a in the depth direction (z direction). Similarly, the second exhaust ports 413b, 413b' are symmetrical to each other with respect to the geometric center C in the length direction (y direction). The first exhaust ports 413a, 413a' and the second exhaust ports 413b, 413b' are symmetrically arranged circumferentially around the distribution hole pattern 412a.

Figure 11:
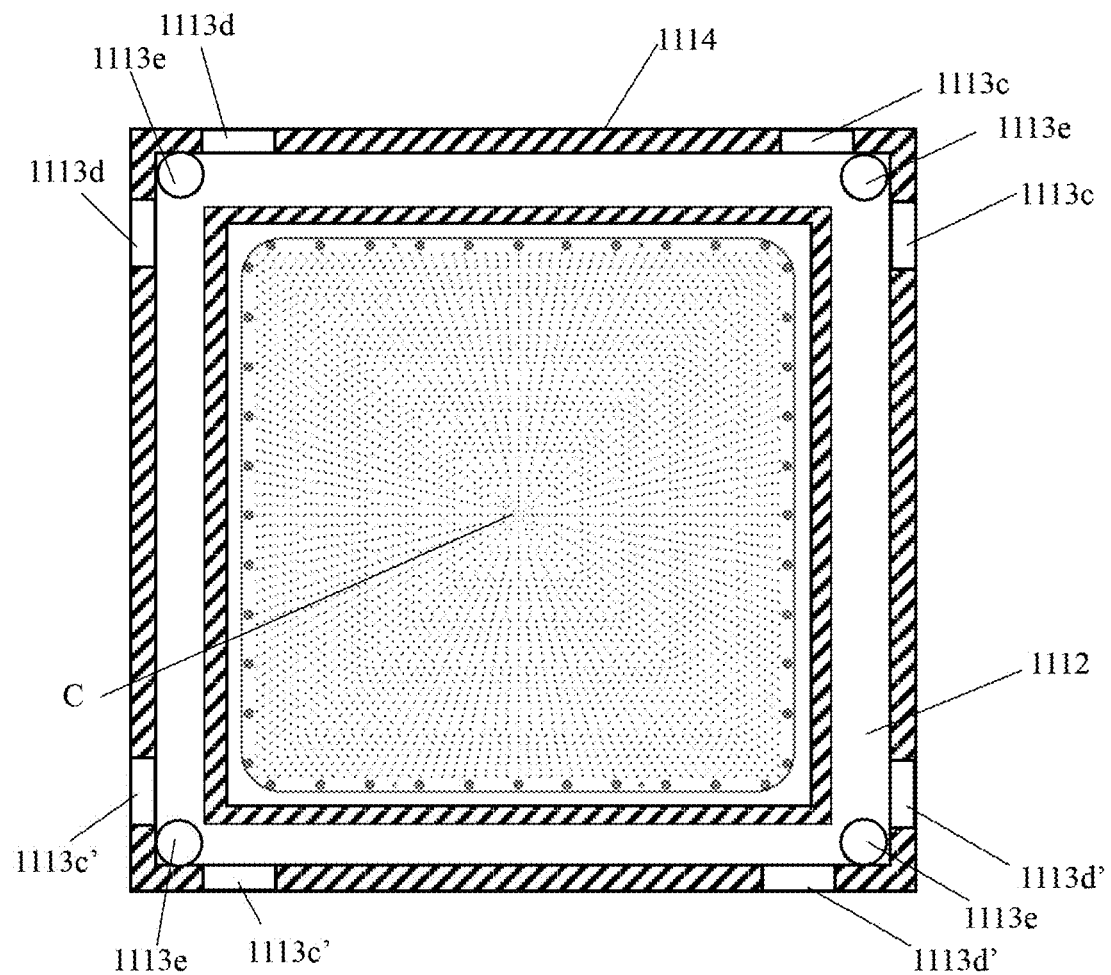
FIG. 11 shows a schematic cross-sectional view of a substrate processing apparatus according to some embodiments of the present disclosure.

Referring to FIG. 11, two corner regions on the diagonal of the annular wall 1114 of the exemplary cavity member 1110 are provided with third exhaust ports 1113c, 1113c'. The third exhaust ports 1113c, 1113c' are arranged around the distribution hole pattern 1112a and symmetrical to the geometric center C along the direction of the diagonal line of the distribution hole pattern 1112a. Similarly, the fourth exhaust ports 1113d, 1113d' are symmetrical to the geometric center C in the other diagonal direction. The chamber member 1111 is further provided with fifth exhaust ports 1113e in the four corner regions of the cavity member 1111, which are symmetrical to the geometric center C in a radiation direction.

In some embodiments, the chamber member is provided with exhaust ports distributed on both sides of the bisecting plane (for example, the bisecting plane BT of FIG. 3). For example, each inlet wall 1112 of the chamber member 1110 (only one wall 1112 is shown in the current illustration) is provided with four fifth exhaust ports 1113e. In other words, the chamber member 1110 is provided with eight fifth exhaust ports 1113e equally distributed at both sides of the bisecting plane.

Figure 5:
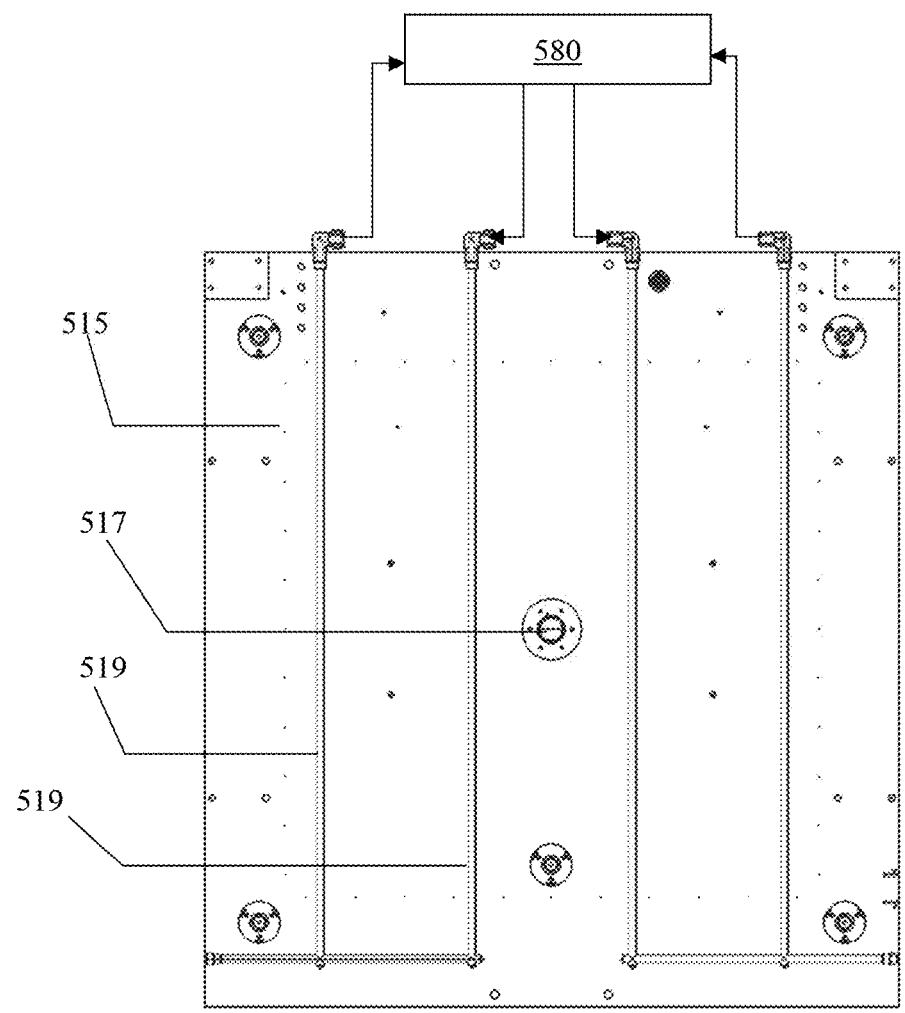
FIG. 5 shows a schematic cross-sectional view of an inlet wall according to some embodiments of the present disclosure.

FIG. 5 shows a schematic cross-sectional view of a plasma intake wall according to some embodiments of the present disclosure. For simplicity and clarity of description, some details/sub-components of the exemplary system are not explicitly marked/shown in this figure. In some embodiments, FIG. 5 represents a cross-sectional view along the section line V-V in FIG. 3.

The lid member 515 of the inlet wall shown in FIG. 5 is provided with an inlet port 517 configured to receive output from a remote plasma source. In some embodiments, the inlet port 517 is provided in the central region of the cover 515. In some embodiments, the central area (e.g., corresponds to the central area CR of FIG. 4) of the flow distribution pattern (such as the aperture pattern 412a shown in FIG. 4) projectively overlaps the inlet port 517, thus providing blockage against the direct ultraviolet input from a RPS. In some embodiments, a lateral projection of the inlet 517 (e.g., on y-z plane) falls within the aforementioned central region CR. In some embodiments, the inlet port defines a first geometric planar profile; the central region defines has a second geometric planar profile, and the first geometric plane profile is substantially different from the first geometric plane profile. In some embodiments, the inlet port 517 presents a substantially circular planar profile, while the central region CR has a substantially rectangular planar profile.

In some embodiments, the cover 515 of the inlet wall is further provided with a flow runner/channel network (e.g., channel pattern 519) that offsets the central region thereof. The flow channel 519 is configured to establish fluidic communicate with a fluid source 580. In some operating scenarios, when the temperature state of the cover 515 is not high enough (e.g., lower than 30 Celsius degree), process byproducts (e.g., $C_xH_yO_z, C_xF_y$) may condense on the cover 515 and/or the spray head (e.g., component 416 as shown in FIG. 4). The generation of such condensation may hinder chamber maintenance efforts, and may also affect longevity of the hardware components. By controlling the temperature setting of the fluid source 580, the temperature state of the cover 515 and/or the shower head may be adjusted to prevent such condensation, thereby ensuring surface characteristics of the cover 515 and/or the spray head. For example, in a thinning process, proper temperature setting of the fluid source 580 (e.g., maintaining temperature state of the cover 515 at about 30 to 100 Celsius degree) may help reducing condensation of byproducts over the internal hardware. The fluid runners shown in the figure can be formed by drilling. In other embodiments, the flow channel 519 in the cover 515 may be formed by computerized numerical control (CNC) techniques.

Figure 6:
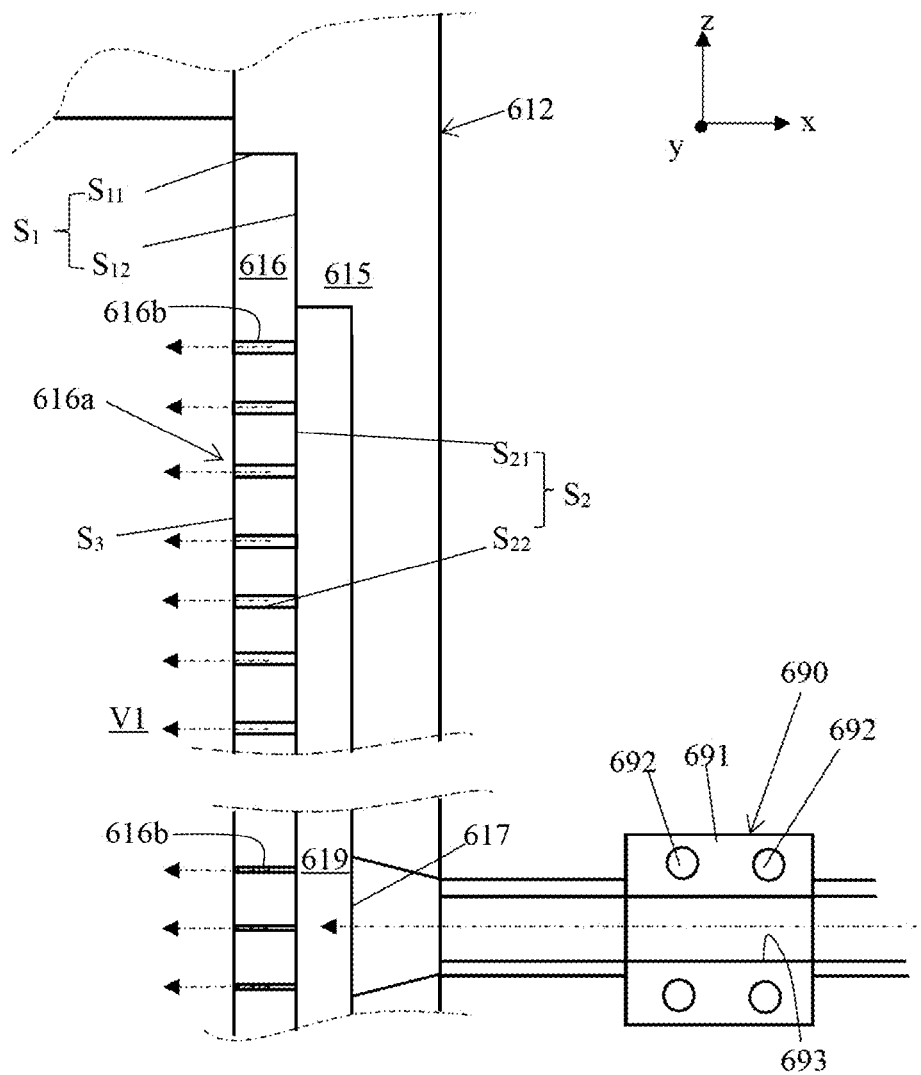
FIG. 6 shows a schematic regional cross-sectional view of an inlet wall according to some embodiments of the present disclosure.

FIG. 6 shows a schematic regional cross-sectional view of a plasma intake wall according to some embodiments of the present disclosure. For simplicity and clarity of description, some details/subcomponents of the exemplary system are not explicitly marked or shown in this figure.

The plasma inlet wall 612 has a hollow structure that defines a plasma distribution volume 619, which is in fluid communication with the inlet 617 and the distribution aperture array 616b. The output from the remote plasma source (not shown in the figure) may enter the plasma distribution volume 619 through the inlet 617, and then enter the subspace V1 through the distribution aperture 616b. In some embodiments, the structural design of the top and/or bottom aperture side wall profile $S_{22}$ of the aperture 616b may be further tuned to minimize flow turbulence. In some embodiments, the side wall profile of the aperture is provided with chamfer profile.

In some embodiments, the device further includes a valve module 690, which is arranged between the remote plasma source (upstream of the valve 690, not shown in the figure) and the inlet 617. The valve module 690 is configured to regulate fluid communication from the RPS to the processing region V1. In some operating scenarios, the substrate loading and/or unloading process may disrupt the vacuum condition established in the processing region. If the remote plasma source is kept in full fluid connection with the process chamber, it may be susceptible to frequent pressure fluctuations and thus suffer reduction of service life. The provision of valve 690 allow blockage of the fluid communication between processing region in the chamber and the remote plasma source, thus may help to prolong the service life of the remote plasma source. In some embodiments, the valve body 691 of the valve module 690 comprises a metal material, such as aluminum or stainless steel (for example, Steel Special Use Stainless, SUS). In some applications, stainless steel valve body is used for its competitive cost and material strength. However, the use of SUS valve bodies may increase recombination rate of fluorine based radicals after dissociation. Such recombination reaction (exothermic reaction) may raise temperature of the valve body. However, the SUS valve body and sealing members therein may be prone to worn out due to elevated temperature conditions. In some embodiments, in order to reduce the recombination of the dissociated fluorine radicals over surface of the SUS valve body, the surface of the valve body and/or the connecting pipe exposed to the free radical environment (such as the inner surface 693) may be provided with surface coating (e.g., with a layer Teflon (PTFE)). Such arrangement may help to alleviate the recombination of dissociated fluorine free radicals and the erosion of the fluorine free radicals on the valve body. In some embodiments, the valve body and the pipe are made of aluminum alloy with surface treatment (e.g., anodizing) that helps to reduce recombination of free radicals (e.g., fluorine). In some embodiments, the aluminum valve body may be used to help reduce the recombination rate of fluorine radicals. In some embodiments, the valve module is further provided with a cooling structure. The cooling structure may be provided with a fluid channel 692 embedded in the valve body 691. The flow channel 692 is configured to receive coolant from a fluid source. In some embodiments, the cooling structure may be further provided with a thermoelectric cooling chip. In some embodiments, the valve body may comprise a ball-valve or gate-valve type vacuum valve member configured to regulate fluid flow rate.

In the illustrated embodiment, the inlet wall 612 includes a lid member 615 and a distribution member 616. The cover 615 is configured to establish sealing closure of the process chamber. In the illustrated embodiment, a shower head (for example, the plasma distribution member 616) is detachably installed on the cover 615. The plasma distribution member 616 is formed with a distribution aperture pattern 616a arranged in the flow path of reaction gas (from the RPS), and is designed to uniformly guide the RPS output toward the surface of the substrate. The plasma distribution part 616 may be disposed between the inlet port 617 and the substrate carrier. For instance, in the illustrated embodiment, the plasma distribution component 616 is arranged on one side of the inlet port 617 (facing the inside of the plasma distribution space 619) and facing interior of the chamber member. In the illustrated embodiment, the plasma intake wall 612 adopts a two-piece design (i.e., having structurally separated plasma distribution member 616 and the cover 615). In other embodiments, the plasma distribution component and the cover may be fabricated as a unitary integral structure.

In some embodiments, the surface of the shower head (such as the plasma distribution member 616) may be provided with an oxide layer to inhibit the recombination of adjacent free radicals, so as to maintain the activity of the free radicals. However, oxide layer generally has a large surface resistance, which is not conducive to building a radio frequency loop. In some embodiments, the interface $S_1$ between the plasma distribution member 616 and the cover 615 is formed with a surface resistance value lower than that of the surface area $S_2$ of the plasma distribution member 616 (e.g., the area that exposes to the plasma distribution volume). This design may establish a radio frequency loop through the shower head, the cover, the surrounding wall (such as the retaining ring), the flexible conductive member, the substrate carrier, and the RF electrode. The illustrated interface $S_1$ comprises a surrounding surface $S_{11}$ of the shower head and a periphery portion $S_{12}$ of outer sidewall surface of the shower head. In some embodiments, the surface area $S_2$ of the plasma distribution member 616 exposed to the plasma distribution space 619 comprises: 1) area $S_{21}$ on the sidewall surface portion of the plasma distribution part 616 (area not in contact with the cover 615) and 2) area $S_{22}$ that defines the sidewall of the distribution aperture 616b. In some embodiments, the surface resistance value of the surface area $S_3$ of the plasma distribution component 616 (area facing the substrate carrier) is also provided with lower surface resistance than that of the surface area $S_2$. This arrangement is conducive to the establishment of the radio frequency loop.

In some embodiments, the shower head 616 is made of conductive material, such as metal. In some embodiments, the shower head 616 may be fabricated from aluminum plate. In some methods of manufacturing shower heads, the aluminum plate is first anodized, so an oxide layer is formed over the surface of the aluminum plate. Subsequently, selective surface treatment may be performed over the aluminum plate. For instance, the oxide layer over the entire inner sidewall surface (such as surface area $S_3$), the surrounding surface (such as surface area $S_{11}$), and the peripheral portion of the outer sidewall surface (such as surface area $S_{12}$) of the aluminum plate may be processed, so that surface resistance value over the aforementioned regions is reduced (lower than surface area $S_{21}$). The process may involve oxide layer reduction/removal treatment on the surfaces (such as surface area $S_3$, $S_{11}$, $S_{12}$), through technique such as etching or polishing. In some embodiments, it can be observed that the inner sidewall surface (e.g., surface area $S_3$) and surrounding surface (e.g., surface area $S_{11}$) of shower head 616 are formed with metallic luster. In some embodiments, the peripheral portion (e.g., surface area $S_{12}$) of the outer sidewall surface of the shower head 616 is formed with metallic luster. In some embodiments, the part of the shower head surrounded by the peripheral portion (for example, the surface area $S_{21}$) is formed with a relatively darker color, such as earth color.

Figure 7:
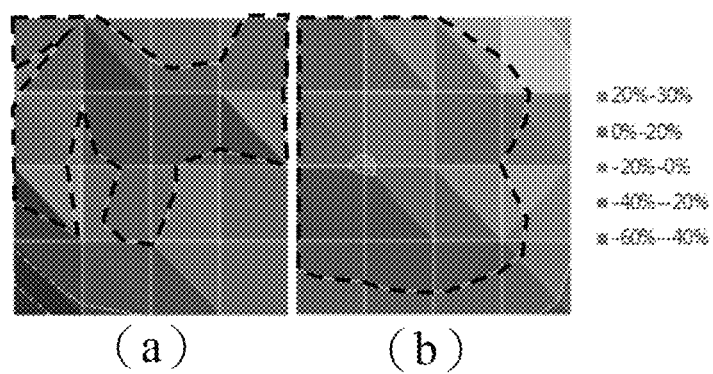
FIG. 7 shows experimental test data of a substrate processing apparatus in accordance with some embodiments of the present disclosure.

FIG. 7 shows experimental data according to some embodiments of the present disclosure. The left hand picture (a) shows the result of an etching process using a shower head without surface treatment. The right hand picture (b) shows a result of an etching process using a shower head with the aforementioned surface treatment (e.g., shower head 616 in FIG. 6). The 4×4 grid blocks shown on the left (a) and right (b) correspond to the locations of an etched surface over a rectangular substrate. Each grid block is filled with different gray scale shadings to show the etching rate measured from the experiment. The percentage range shown on the right hand side of FIG. 7 represents the percentage range obtained relative to a reference etching rate (in um/min), and is expressed in a manner corresponding to different gray scale levels. It can be observed from the data that compared to a shower head without surface treatment, the use of a shower head provided with different surface characteristics (e.g., shower head 616 in FIG. 6) may significantly improve the etch uniformity over the substrate surface. For example, the dotted lines in the pictures encircles the area with a relatively small etch rate difference/ratio (0-20%, where etch rate is more uniform). As can be seen from the figure, the dotted frame on the right picture (b) encircles a larger area. It is found that the use of the shower head in accordance with the instant disclosure (e.g., the spray head 616 in FIG. 6) may increase the uniformity of the substrate surface etch rate by more than 15% (e.g., by 16.7%).

Figure 8:
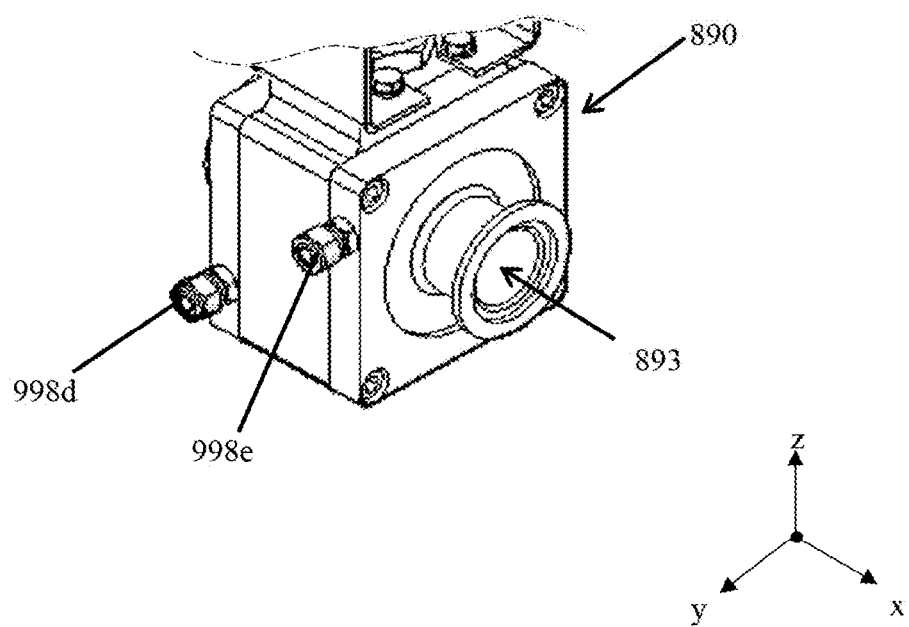
FIG. 8 shows a schematic view of a valve module according to some embodiments of the present disclosure.
Figure 10:
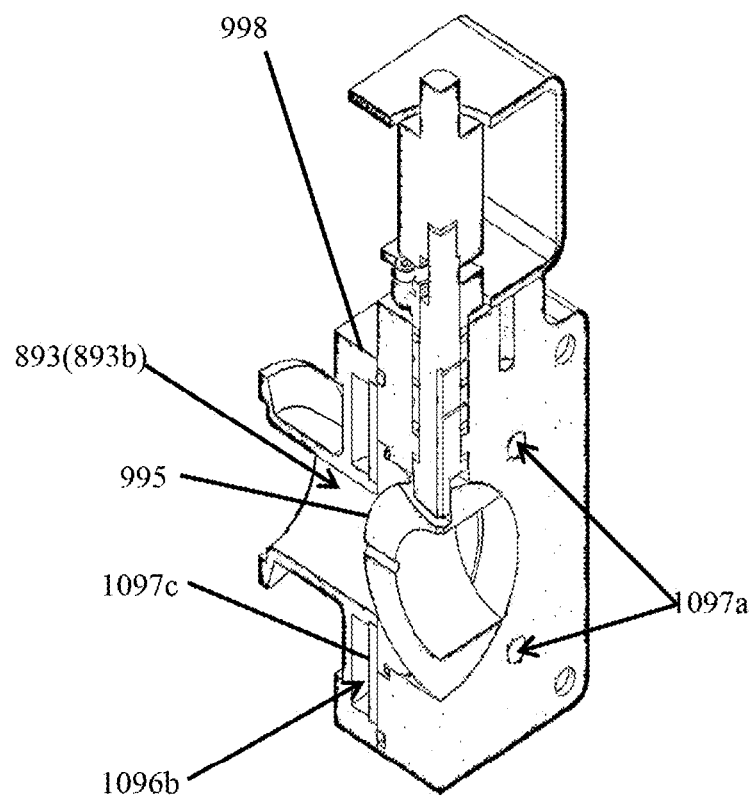

FIG. 8 shows a schematic view of a valve module according to some embodiments of the present disclosure. FIG. 9 shows a schematic cross-sectional view of a valve module according to some embodiments of the present disclosure. FIG. 10 shows a schematic cross-sectional view of a valve module according to some embodiments of the present disclosure. For simplicity and clarity of description, some details/subcomponents of the exemplary system are not explicitly marked or shown in this figure.

Referring to FIG. 8, the valve module 890 is formed with a passage 893 configured to establish fluid connection between a RPS (such as RPS 320) and an inlet (e.g., inlet 317) of a chamber member (such as chamber member 310). In particular, the passage 893 includes an upstream section (for example, the upstream section 893a in FIG. 9) and a downstream section (e.g., downstream section 893b in FIG. 10) in fluid communication with the RPS and the chamber member, respectively.

Please refer to FIG. 9 and FIG. 10 concurrently, the exemplary valve module 890 includes a valve member 995 configured to adjust the flow rate through the passage 893, and a valve body 997 configured to receive the valve member 995. Specifically, the valve body 997 defines a section of the passage 893, which is located between the upstream section 893a and the downstream section 893b. The valve member 995 is arranged in the section defined by the valve body 997, the upstream and downstream of the valve member 995 respectively correspond to the RPS and the chamber member. The valve module 890 also includes a valve stem 999 configured to control the orientation of the valve member 995 provided with a spherical appearance, thereby adjusting the fluid flow in the passage 893.

In some embodiments, the valve module 890 includes a pair of cooling channels (e.g., the first cooling channel 996a of FIG. 9 and the second cooling channel 1096b of FIG. 10). The first cooling channel 996a is formed over upstream of the valve member 995 and arranged surrounding a cross section of the upstream section 893a; and the second cooling channel 1096b is formed over downstream of the valve member 995 and arranged surrounding the downstream section 893b of the passage 893.

In the illustrated embodiment, the valve module 890 further includes a pair of adapters 998. The valve body 997 is formed with an upstream surface 997b and a downstream surface (for example, the surface 1097c shown in FIG. 10). The pair of adapters 998 are respectively mounted on the upstream surface 997b and the downstream surface 1097c to cooperatively form the first cooling channel 996a and the second cooling channel 1096b surrounding the passage 893. The adapter 998 includes a pipe 998a forming the upstream section 983a (or downstream section 983b) of the passage 893, a flange 998b arranged to surround the pipe body 998a and spaced from the upstream surface 997b (or downstream surface 1097c), and a lip 998c configured to establish a sealing engagement with the upstream face 997b (or downstream face 1097c). In the embodiment, the fluid in the cooling channel would directly contact the upstream surface 997b (or downstream surface 1097c) and the pipe 998a, so that the temperature of the components (i.e., the valve body 997 and the pipe 998a) that forms the passage 893 can be effectively adjusted. In some embodiments, the adapter may be integrally formed with the valve body. In some embodiments, the material and/or surface treatment of the valve module 890 may be similar to the foregoing embodiments.

In some embodiments, the pair of cooling channels are in fluid communication with each other. For example, the valve body 997 is formed with a plurality of communication holes (for example, the through holes 997a shown in FIG. 9 and the 1097a shown in FIG. 10), which allow the upstream surface 997b and the downstream surface 1097c of the valve body 997 to be in fluid communication with each other. The valve module 890 also includes a fluid inlet port and a fluid outlet port (for example, the inlet connector 998 and the outlet connector 998e in FIG. 8). The cooling fluid is allowed to enter the first cooling channel 996a through the inlet connector 998, then enter the second cooling channel 1096b through the communication hole, and then be extracted from the water outlet connector 998e.

One aspect of the present disclosure discloses a substrate processing apparatus, comprising: a chamber member that defines an interior volume that has an aspect ratio. The chamber member comprising: a pair of laterally opposing inlet walls, each having an inlet port configured to receive output from a remote plasma source, and a loading port arranged between the pair of inlet walls, configured to allow passage of a substrate into the interior volume.

In some embodiments, the aspect ratio of the interior volume is no greater than 1.

In some embodiments, the loading port is configured to allow passage of a vertically oriented substrate into the interior volume.

In some embodiments, inlet port of the inlet wall has a first geometric planner profile, configured to receive output from the remote plasma source; each one of the inlet walls is provided with a distributing hole pattern arranged toward the interior volume of the chamber member; a central region of the distributing hole pattern projectivly overlaps the inlet port, the central region has a second geometric planner profile; wherein the first geometric planner profile is different from the second geometric planner profile.

In some embodiments, holes in the central region of the distributing hole pattern is provided with narrower width than holes in a periphery region of the distributing hole pattern that surrounds the central region.

In some embodiments, the distributing hole pattern is formed on a plasma distributing member arranged over one side of the inlet port that faces the interior volume of the chamber member; a plasma distributing volume is formed between the plasma distributing member and the inlet port; and a surface of the plasma distributing member that exposes to the plasma distributing volume has surface resistance value larger than that of a surface of the plasma distributing member facing the interior of the chamber.

In some embodiments, at least one of the inlet walls comprises a lid member detachable from the chamber member and configured to establish a sealing engagement therewith; the plasma distributing member is detachably mounted on the lid member; an interface between the plasma distributing member and the lid member is provided with surface resistance smaller than that of the surface of the plasma distributing member that exposes to the plasma distributing volume.

In some embodiments, the chamber member is provided with a plurality of exhaust ports symmetrically arranged around the distributing hole pattern.

In some embodiments, the exhaust ports are arranged respectively around corner regions of the chamber member.

In some embodiments, upon receipt of the substrate, the substrate defines a bisecting plane that divides the interior volume, the exhaust ports are distributed over both sides of the plane.

In some embodiments, the exhaust ports are provided on the inlet walls.

In some embodiments, the inlet wall is provided with an annular partition structure protrudingly arranged from a substrate-facing surface of the inlet wall and surround the distributing hole pattern.

In some embodiments, the apparatus of claim further comprises a substrate carrier having a retaining frame body configured to retain the substrate at its edge and to transport the substrate through the loading port of the chamber member into the interior volume. The annular partition structure comprises a perforated plate facing the distributing hole pattern. The substrate carrier is maintained with a lateral clearance from the perforated plate of the annular partition structure. A ratio between a hole width of the perforated plate and a width of the lateral clearance is substantially the same.

In some embodiments, the apparatus of claim further comprises: a valve member arranged in a passage between the RPS and the inlet port of the chamber member, configured to regulate fluid flow through the passage; and a pair of cooling channels arranged respectively over upstream and downstream of the valve member. The cooling channels are in fluid connection with each other; each of the cooling channels is arranged around a cross section of the passage.

In some embodiments, the apparatus of claim further comprises: a valve body defining a segment of the passage between the RPS and the chamber member, wherein the valve member is arranged in the valve body, the valve body having an upstream face and a downstream face; and a pair of adaptors respectively mounted over the upstream face and downstream face so as to cooperatively form the cooling channels that surrounds the passage.

Another aspect of the present disclosure discloses a substrate processing apparatus comprising a chamber member and a pair of remote plasma sources. The chamber member defines an interior volume that has an aspect ratio no greater than 1. The chamber member comprises: a pair of laterally opposing inlet walls, each having an inlet port; and a loading port arranged laterally between the pair of inlet walls, configured to allow passage of a vertically oriented substrate carrier having a retaining frame body into the interior volume. The pair of remote plasma sources respectively arranged laterally over the inlet walls, each one of which being accessible through the inlet ports on the inlet walls.

In some embodiments, each one of the inlet walls is provided with a distributing hole pattern having a substantially rectangular planar profile arranged toward the interior volume of the chamber member. The chamber member is provided with a plurality of exhaust ports symmetrically arranged around the distributing hole pattern.

In some embodiments, the exhaust ports are arranged respectively around corner regions of the chamber member.

In some embodiments, upon receipt of the substrate, the substrate defines a bisecting plane that divides the interior volume. The exhaust ports are distributed over both sides of the plane.

The embodiments shown and described above are only examples. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A substrate processing apparatus, comprising:
a chamber member that defines an interior volume having an aspect ratio, the chamber member comprising:
a pair of laterally opposing inlet walls, each one of the pair of inlet walls having an inlet port that is configured to receive output from a remote plasma source and having a first geometric planner profile, and
a loading port arranged laterally between the pair of inlet walls, and configured to allow passage of a substrate into the interior volume, wherein:
each one of the pair of inlet walls is provided with a distributing hole pattern arranged toward the interior volume of the chamber member,
a central region of the distributing hole pattern projectively overlaps the inlet port,
the central region has a second geometric planner profile, and
the first geometric planner profile is different from the second geometric planner profile.

2. The substrate processing apparatus of claim 1, wherein the aspect ratio of the interior volume is equal to or less than 1.

3. The substrate processing apparatus of claim 1, wherein the loading port is further configured to allow passage of a vertically oriented substrate into the interior volume.

4. The substrate processing apparatus of claim 1, wherein holes in the central region of the distributing hole pattern are provided with narrower width than holes in a periphery region of the distributing hole pattern that surrounds the central region.

5. The substrate processing apparatus of claim 1, wherein the distributing hole pattern is formed on a plasma distributing member arranged over one side of the inlet port that faces the interior volume of the chamber member,
a plasma distributing volume is formed between the plasma distributing member and the inlet port, and
a surface of the plasma distributing member that is exposed to the plasma distributing volume has a surface resistance value larger than a surface resistance value of a surface of the plasma distributing member facing the interior volume of the chamber member.

6. The substrate processing apparatus of claim 5, wherein
at least one of the pair of inlet walls comprises a lid member detachable from the chamber member,
the lid member is configured to establish a sealing engagement with the chamber member,
the plasma distributing member is detachably mounted on the lid member, and
an interface between the plasma distributing member and the lid member is provided with a surface resistance smaller than a surface resistance of the surface of the plasma distributing member that is exposed to the plasma distributing volume.

7. The substrate processing apparatus of claim 1, wherein the chamber member is provided with a plurality of exhaust ports symmetrically arranged around the distributing hole pattern.

8. The substrate processing apparatus of claim 7, wherein the plurality of exhaust ports is arranged around each of a plurality of corner regions of the chamber member.

9. The substrate processing apparatus of claim 7, wherein
the substrate defines a bisecting plane that divides the interior volume after the substrate is received, and
the plurality of exhaust ports is distributed over both sides of the plane.

10. The substrate processing apparatus of claim 7, wherein the plurality of exhaust ports is provided on the pair of inlet walls.

11. The substrate processing apparatus of claim 1, wherein each one of the pair of inlet walls is provided with an annular partition structure protrudingly arranged from a substrate-facing surface of the pair of inlet walls and surrounds the distributing hole pattern.

12. The substrate processing apparatus of claim 1, further comprising:
a substrate carrier having a retaining frame body that is configured to retain edge of the substrate and to transport the substrate through the loading port of the chamber member into the interior volume, wherein
an annular partition structure comprises a perforated plate facing the distributing hole pattern,
the substrate carrier is maintained with a lateral clearance from the perforated plate of the annular partition structure, and
a ratio between a hole width of the perforated plate and a width of the lateral clearance is substantially the same.

13. The substrate processing apparatus of claim 1, further comprising:
a valve member arranged in a passage between the remote plasma source and the inlet port of the chamber member, and configured to regulate fluid flow through the passage; and
a pair of cooling channels correspondingly arranged over upstream and downstream of the valve member, wherein
the pair of cooling channels is in fluid connection with each other, and
the pair of cooling channels is arranged around a cross section of the passage.

14. The substrate processing apparatus of claim 13, further comprising:
a valve body defining a segment of the passage between the remote plasma source and the chamber member, wherein the valve member is arranged in the valve body, the valve body having an upstream face and a downstream face, and
a pair of adaptors respectively mounted over the upstream face and downstream face to cooperatively form the pair of cooling channels that surrounds the passage.

15. A substrate processing apparatus, comprising:
a chamber member that defines an interior volume having an aspect ratio not greater than 1, the chamber member comprising:
a pair of laterally opposing inlet walls, each one of the pair of inlet walls having an inlet port and having a first geometric planner profile; and,
a loading port arranged laterally between the pair of inlet walls, and configured to allow passage of a vertically oriented substrate carrier having a retaining frame body into the interior volume; and
a pair of remote plasma sources respectively arranged laterally over the pair of inlet walls, each one of the pair of remote plasma sources being accessible through inlet ports on the pair of inlet walls, wherein:
the inlet ports are configured to receive output from the pair of remote plasma sources,
each one of the pair of inlet walls is provided with a distributing hole pattern arranged toward the interior volume of the chamber member,
a central region of the distributing hole pattern projectively overlaps the inlet port,
the central region has a second geometric planner profile, and
the first geometric planner profile is different from the second geometric planner profile.

16. The substrate processing apparatus of claim 15, wherein
the distributing hole pattern has a substantially rectangular planar profile arranged toward the interior volume of the chamber member, and
the chamber member is provided with a plurality of exhaust ports symmetrically arranged around the distributing hole pattern.

17. The substrate processing apparatus of claim 16, wherein the plurality of exhaust ports is arranged around each of a plurality of corner regions of the chamber member.

18. The substrate processing apparatus of claim 16, wherein
the substrate defines a bisecting plane that divides the interior volume after the substrate is received, and
the plurality of exhaust ports is distributed over both sides of the plane.

19. The substrate processing apparatus of claim 16, wherein the plurality of exhaust ports is provided on the pair of inlet walls.

* * * * *